US009773855B2

(12) United States Patent
Wu

(10) Patent No.: US 9,773,855 B2
(45) Date of Patent: Sep. 26, 2017

(54) ARRAY SUBSTRATE, FABRICATING METHOD THEREOF, AND DISPLAY DEVICE

(71) Applicant: BOE TECHNOLOGY GROUP CO., LTD, Beijing (CN)

(72) Inventor: Yanbing Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/108,607

(22) PCT Filed: Dec. 10, 2015

(86) PCT No.: PCT/CN2015/096954
§ 371 (c)(1),
(2) Date: Jun. 28, 2016

(87) PCT Pub. No.: WO2017/008434
PCT Pub. Date: Jan. 19, 2017

(65) Prior Publication Data
US 2017/0148864 A1    May 25, 2017

(30) Foreign Application Priority Data
Jul. 13, 2015   (CN) .......................... 2015 1 0409446

(51) Int. Cl.
*H01L 27/32*       (2006.01)
*G09G 3/3266*     (2016.01)
(Continued)

(52) U.S. Cl.
CPC ....... *H01L 27/3276* (2013.01); *G09G 3/3225* (2013.01); *G09G 3/3266* (2013.01);
(Continued)

(58) Field of Classification Search
CPC .......................... H01L 27/3276; G09G 3/3648
See application file for complete search history.

(56) References Cited

U.S. PATENT DOCUMENTS 6,753,846 B2 *  6/2004  Takeuchi ................ G09F 9/305
                                                             345/108
9,293,517 B2 *  3/2016  Li ..................... G02F 1/136227
(Continued)

FOREIGN PATENT DOCUMENTS

CN      203554527 U     4/2014
CN      103886823 A     6/2014
(Continued)

OTHER PUBLICATIONS

The World Intellectual Property Organization (WIPO) International Search Report for PCT/CN2015/096954 Apr. 1, 2016.

*Primary Examiner* — Evan Pert
(74) *Attorney, Agent, or Firm* — Anova Law Group, PLLC

(57) ABSTRACT

An array substrate, a method for fabricating the array substrate, and a related display device are provided. The array substrate comprises: a base substrate with a plurality of first via holes; a plurality of first signal lines on a first side of the base substrate; and a plurality of first signal driver lines on a second side of the base substrate; wherein each first signal line is connected with at least one first signal driver line through at least one first via hole.

16 Claims, 4 Drawing Sheets

(51) Int. Cl.
*G09G 3/3225* (2016.01)
*H01L 51/56* (2006.01)

(52) U.S. Cl.
CPC ..... *H01L 51/56* (2013.01); *G09G 2300/0426* (2013.01); *G09G 2310/0264* (2013.01)

(56) References Cited

U.S. PATENT DOCUMENTS

| | | | |
|---|---|---|---|
| 2002/0080298 A1* | 6/2002 | Fukayama | G02F 1/133308 349/58 |
| 2002/0118325 A1* | 8/2002 | Hinata | G02F 1/1345 349/113 |
| 2010/0296016 A1 | 11/2010 | Chen et al. | |
| 2015/0282293 A1* | 10/2015 | Lim | G02F 1/13452 361/749 |
| 2017/0032735 A1* | 2/2017 | Lee | G09G 3/3225 |

FOREIGN PATENT DOCUMENTS

| | | |
|---|---|---|
| CN | 104732908 A | 6/2015 |
| CN | 104916252 A | 9/2015 |

\* cited by examiner

ARRAY SUBSTRATE, FABRICATING METHOD THEREOF, AND DISPLAY DEVICE

CROSS-REFERENCES TO RELATED APPLICATIONS

This PCT patent application is a national phase entry under 35 U.S.C. §371 of International Application No. PCT/CN2015/096954, filed on Dec. 10, 2015, which claims priority of Chinese Patent Application No. 201510409446.4 filed on Jul. 13, 2015. The above enumerated patent applications are incorporated by reference herein in their entirety.

TECHNICAL FIELD

The disclosed subject matter generally relates to the display technologies and, more particularly, relates to an array substrate, a related fabricating method thereof, and a display device containing the same.

BACKGROUND

As an intelligent device, smart watch attracts many attentions. Generally, a control chip needs to be configured in a display panel of a smart watch, while the display panel requires a narrow frame characteristic. Therefore, a conventional display panel of a smart watch may not have a perfectly-round shape. For example, as illustrated in FIG. 1, on display panel 1, gate lines are in a transverse direction, while data lines are in a longitudinal direction. The gate lines and the data lines crossover from each other and form a plurality of sub-pixels on display panel 1. In order to ensure the narrow frame requirement, drive circuit is not configured outside the circular area. As illustrate in FIG. 1, an arc of the bottom of circular display panel 1 is used to configure driver circuit 2. The display panel 1 does not have a perfect circle shape.

Accordingly, it is desirable to provide array substrate, related display device, as well as new fabricating method.

BRIEF SUMMARY

In accordance with some embodiments of the disclosed subject matter, an array substrate, a method for fabricating the array substrate, and a related display device are provided.

An aspect of the present disclosure provides an array substrate. The array substrate comprises: a base substrate with a plurality of first via holes, a plurality of first signal lines on a first side of the base substrate, and a plurality of first signal driver lines on a second side of the base substrate, wherein each first signal line is connected with at least one first signal driver line through at least one first via hole.

In some embodiments, the array substrate further comprises a plurality of second signal lines on the first side of the base substrate.

In some embodiments, the array substrate further comprises a plurality of second signal driver lines on the second side of the base substrate, wherein the base substrate further comprises a plurality of second via holes, and each second signal line is connected with at least one second signal driver line through at least one second via hole.

In some embodiments, the array substrate further comprises a plurality of signal auxiliary lines on the first side of the base substrate, wherein each second signal line is connected with at least one signal auxiliary line.

In some embodiments, the array substrate further comprises a plurality of second signal driver lines on the second side of the base substrate, wherein the base substrate further comprises a plurality of second via holes, and each signal auxiliary line is connected with at least one second signal driver line through at least one second via hole.

In some embodiments, the plurality of first signal lines are data lines, the plurality of first signal driver lines are source driver lines, the plurality of second signal lines are gate lines, the plurality of second signal driver lines are gate driver lines, and the plurality of signal auxiliary lines are gate auxiliary lines.

In some embodiments, the data lines are parallel to the gate auxiliary lines.

In some embodiments, a total number of the gate lines is equal to a total number of the gate auxiliary lines.

In some embodiments, the data lines and the gate auxiliary lines are in a first layer.

In some embodiments, the gate lines are in a second layer, the base substrate further comprises a plurality of third via holes, the plurality of third via holes are on intersections of the gate lines and the gate auxiliary lines, and each gate line is connected with at least one gate auxiliary line through at least one third via hole.

In some embodiments, the first via holes are on ends of the data lines.

In some embodiments, the second via holes are on ends of the gate auxiliary lines.

In some embodiments, the ends of the data lines and the ends of the gate auxiliary lines are in a first direction.

In some embodiments, the ends of the data lines are in the first direction, and the ends of the gate auxiliary lines are in a second direction that is opposite to the first direction.

In some embodiments, the base substrate is substantially a circle.

In some embodiments, one gate line that is in a center region of the base substrate is longer than another gate line that is in an edge region of the base substrate, and one gate auxiliary line that is in a center region of the base substrate is longer than another gate auxiliary line that is in an edge region of the base substrate.

In some embodiments, one gate line that is in the center region of the base substrate is connected with one gate auxiliary line that is in the edge region of the base substrate.

Another aspect of the present disclosure provides a display apparatus comprising the disclosed array substrate.

In some embodiments, the display apparatus further comprises a driver circuit located on the second side of the base substrate, wherein the gate driver lines and the source driver lines are connected with the driver circuit.

Another aspect of the present disclosure includes a method for fabricating a method for fabricating an array substrate. The method comprises: preparing a base substrate, forming a plurality of first via holes on the base substrate, forming a plurality of first signal lines on a first side of the base substrate, and forming a plurality of first signal driver lines on a second side of the base substrate, wherein each first signal line is connected with at least one first signal driver line through at least one first via hole.

In some embodiments, the method further comprises forming a plurality of second signal lines on the first side of the base substrate.

In some embodiments, the method further comprises forming a plurality of second signal driver lines on the second side of the base substrate, wherein the base substrate further comprises a plurality of second via holes, and each second signal line is connected with at least one second signal driver line through at least one second via hole.

In some embodiments, the method further comprises forming a plurality of signal auxiliary lines on the first side of the base substrate, wherein each second signal line is connected with at least one single auxiliary line.

In some embodiments, the method further comprises forming a plurality of second signal driver lines on the second side of the base substrate, wherein the base substrate further comprises a plurality of second via holes, and each signal auxiliary line is connected with at least one second signal driver line through at least one second via hole.

In some embodiments, the plurality of first signal lines are data lines, the plurality of first signal driver lines are source driver lines, and the plurality of second signal lines are gate lines, the plurality of second signal driver lines are gate driver lines, the plurality of signal auxiliary lines are gate auxiliary lines.

In some embodiments, the data lines are parallel to the gate auxiliary lines.

In some embodiments, a total number of the gate lines is equal to a total number of the gate auxiliary lines.

In some embodiments, the data lines and the gate auxiliary lines are in a first layer.

In some embodiments, the gate lines are in a second layer, the base substrate further comprises a plurality of third via holes, the plurality of third via holes are located on intersections of the gate lines and the gate auxiliary lines, and each gate line is connected with at least one gate auxiliary line through at least one third via hole.

In some embodiments, the first via holes are on ends of the data lines.

In some embodiments, the second via holes are on ends of the gate auxiliary lines.

In some embodiments, the ends of the data lines and the ends of the gate auxiliary lines are in a first direction.

In some embodiments, the ends of the data lines are in the first direction, and the ends of the gate auxiliary lines are in a second direction that is opposite to the first direction.

In some embodiments, the base substrate is substantially a circle.

In some embodiments, one gate line that is in a center region of the base substrate is longer than another gate line that is in an edge region of the base substrate, and one gate auxiliary line that is in a center region of the base substrate is longer than another gate auxiliary line that is in an edge region of the base substrate.

In some embodiments, one gate line that is in the center region of the base substrate is connected with one gate auxiliary line that is in the edge region of the base substrate.

Another aspect of the present disclosure includes a method for fabricating a display apparatus incorporating the method for fabricating the array substrate.

In some embodiments, the method further comprises forming a driver circuit on the second side of the base substrate, wherein the gate driver lines and the source driver lines are connected with the driver circuit.

Other aspects of the present disclosure can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Figure 1:
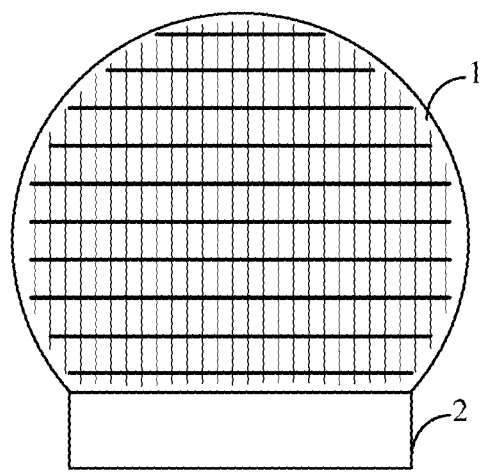
FIG. 1 is a schematic structural diagram of a conventional circular display panel.

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides an array substrate, a method for fabricating the array substrate, and a related display device.

The array substrate can comprises a base substrate with a plurality of first via holes, a plurality of first signal lines on a first side of the base substrate, and a plurality of first signal driver lines on a second side of the base substrate, wherein each first signal line is connected with at least one first signal driver line through at least one first via hole.

In some embodiments, the array substrate further comprises a plurality of second signal lines on the first side of the base substrate, a plurality of second signal driver lines on the second side of the base substrate, wherein the base substrate further comprises a plurality of second via holes, and each second signal line is connected with at least one second signal driver line through at least one second via hole.

In some embodiments, the array substrate further comprises a plurality of signal auxiliary lines on the first side of the base substrate, wherein each second signal line is connected with at least one single auxiliary line.

In some embodiments, the array substrate further comprises a plurality of second signal driver lines on the second side of the base substrate, wherein the base substrate further comprises a plurality of second via holes, and each signal auxiliary line is connected with at least one second signal driver line through at least one second via hole.

In some embodiments, the plurality of first signal lines are data lines, the plurality of first signal driver lines are source driver lines, the plurality of second signal lines are gate lines, the plurality of second signal driver lines are gate driver lines, and the plurality of signal auxiliary lines are gate auxiliary lines.

In some embodiments, the data lines are parallel to the gate auxiliary lines, a total number of the gate lines is equal to a total number of the gate auxiliary lines.

In some embodiments, the data lines and the gate auxiliary lines are in a first layer, the gate lines are in a second layer, the base substrate further comprises a plurality of third via holes, the plurality of third via holes are located on intersections of the gate lines and the gate auxiliary lines, and each gate line is connected with at least one gate auxiliary line through at least one third via hole.

In some embodiments, the first via holes are on ends of the data lines, the second via holes are on ends of the gate auxiliary lines, the ends of the data lines and the ends of the gate auxiliary lines are in a first direction.

In some embodiments, the ends of the data lines are in the first direction, and the ends of the gate auxiliary lines are in a second direction that is opposite to the first direction.

In some embodiments, the base substrate is substantially a circle.

In some embodiments, one data line that is in a center region of the base substrate is longer than another data line that is in an edge region of the base substrate, one gate line that is in a center region of the base substrate is longer than another gate line that is in an edge region of the base substrate, and one gate auxiliary line that is in a center region of the base substrate is longer than another gate auxiliary line that is in an edge region of the base substrate.

In some embodiments, one gate line that is in the center region of the base substrate is connected with one gate auxiliary line that is in the edge region of the base substrate.

Figure 2:
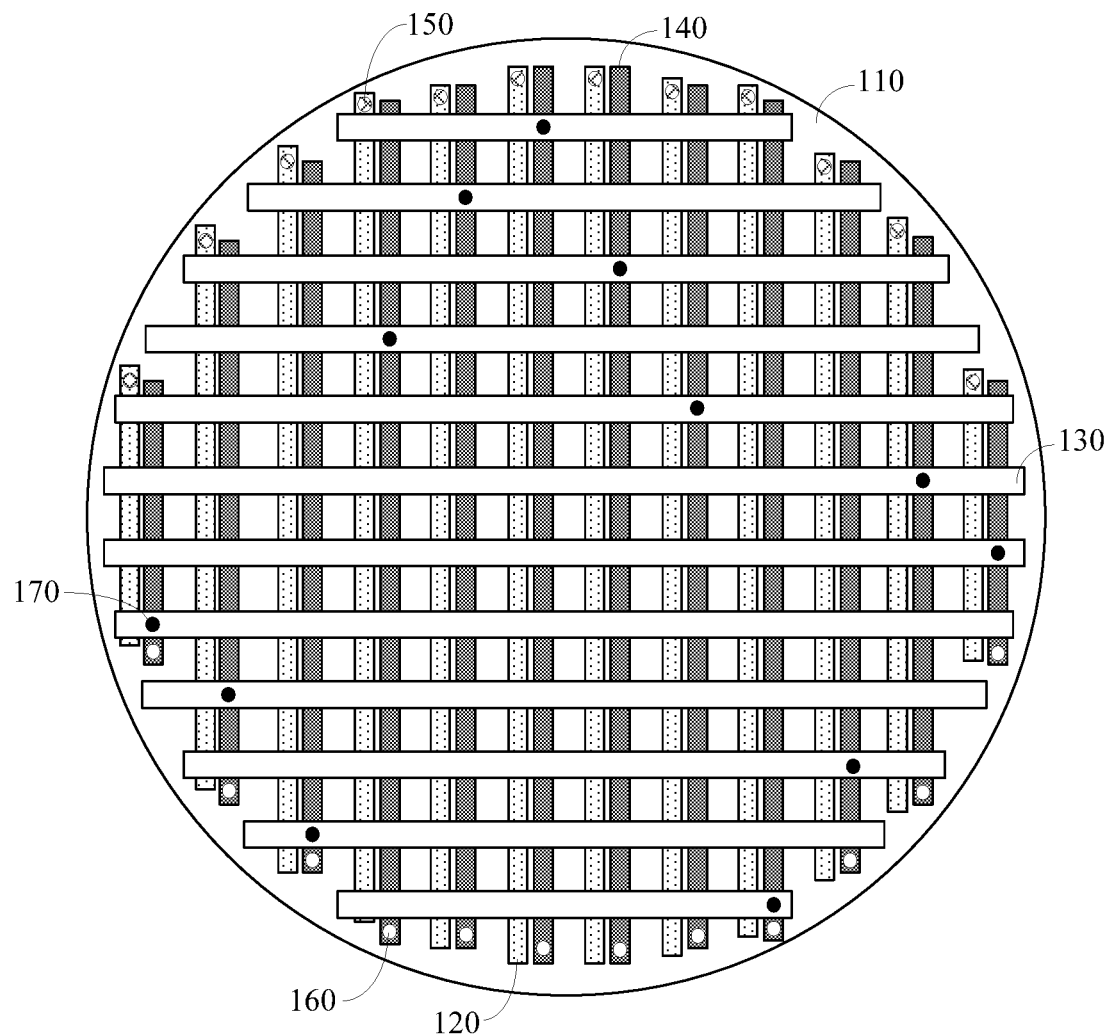
FIG. 2 is a schematic structural diagram of a front view of an exemplary circular array substrate in accordance with some embodiments of the disclosed subject matter.
Figure 3:
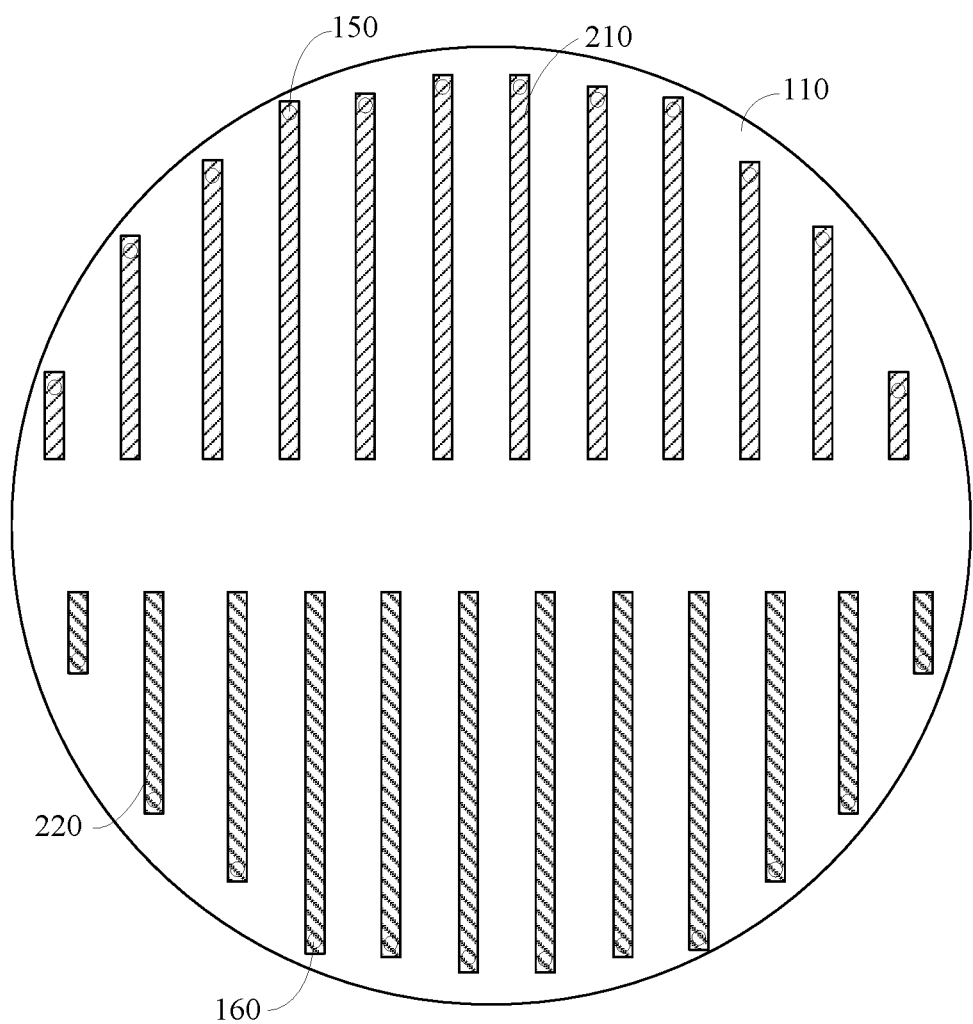
FIG. 3 is a schematic structural diagram of a back view of the exemplary circular array substrate shown in FIG. 2 in accordance with some embodiments of the disclosed subject matter.

FIGS. 2-3 respectively illustrate a front view and a back view of an exemplary circular array substrate in accordance with some embodiments of the disclosed subject matter.

As illustrated in FIG. 2, the front side of the array substrate can include: a first surface, e.g., a front surface, of base substrate 110, multiple data lines 120, multiple gate lines 130, multiple gate auxiliary lines 140, multiple first via holes 150, multiple second via holes 160, and multiple third via holes 170.

In some embodiments, the multiple data lines 120 and the multiple gate lines 130 can be formed on the first surface of base substrate 110. The multiple data lines 120 and the multiple gate lines 130 perpendicularly crossover from each other and form a plurality of sub-pixels at the intersections.

In some embodiments, the multiple gate auxiliary lines 140 can be parallel to the multiple data lines 120. The number of gate auxiliary lines 140 is equal to the number of gate lines 130. Each gate auxiliary line is connected with a corresponding gate line.

On base substrate 110, each first via hole 150 is formed at one end of a corresponding data line 120, while each second via hole 160 is formed at one end of a corresponding gate auxiliary line 140.

Turning to FIG. 3, a schematic structural diagram of an exemplary circular array substrate in a back view is provided in accordance with some embodiments of the disclosed subject matter.

As illustrated, the back side of the array substrate can include: a second surface, e.g., a back surface, of base substrate 110, multiple source driver lines 210, and multiple gate driver lines 220.

In some embodiments, the number of source driver lines 210 is equal to the number of data lines 120, while the number of gate driver lines 220 is equal to the number of gate lines 130.

Each source driver line 210 is connected with a corresponding data line through a corresponding first via hole 150. Each gate driver line 220 is connected with a corresponding gate auxiliary line 140 through a corresponding second via hole 160.

Since each data line 120 and each gate line 130 can correspond to a gate auxiliary line 140 and can be connected to the back side of circular array substrate 100 through a corresponding first via hole 150 and a corresponding second via hole 160, a driver circuit can be disposed on the back side of circular array substrate 100. Therefore, a narrow frame requirement can be fulfilled while the front side of displayer area can be a perfect circle.

In some embodiments, multiple first via holes 150 and multiple second via holes 160 can be located in any suitable locations. For example, multiple first via holes 150 and multiple second via holes 160 can be distributed on the edge of an arc of the circular array substrate.

As another example, as illustrated in FIGS. 2 and 3, all the multiple first via holes 150 can be distributed on the edge of one semicircle which corresponds to the same ends of multiple data lines 120, while all the multiple second via holes 160 can be distributed on the edge of the opposite semicircle which corresponds to the same ends of multiple gate auxiliary lines 140. In such example, the multiple via holes can have an uniform layout and thus can be fabricated commodiously.

In some embodiments, multiple data lines 120, multiple gate lines 130, and multiple gate auxiliary lines 140 can be distributed in any suitable layout. For example, multiple data lines 120, multiple gate lines 130, and multiple gate auxiliary lines 140 can be distributed in three different layers respectfully. As another example, as illustrated in FIG. 2, multiple data lines 120 and multiple gate auxiliary lines 140 can be distributed in a first layer, while multiple gate lines 130 can be formed in a second layer. The second layer is above the first layer. In such an example, a gate line 130 can be connected with its corresponding gate auxiliary line 140 through a via hole 170 that is located on the intersection of the gate line 130 and its corresponding gate auxiliary line 140.

A one-to-one correspondence is between multiple gate lines 130 and multiple gate auxiliary lines 140. In some embodiments, as long as the one-to-one relationship is guaranteed, a gate line 130 can be connected with an arbitrary gate auxiliary line if the resistance there-between is small enough.

In some embodiments, as illustrated in FIG. 2, a long gate line 130 is connected with a short gate auxiliary lines 140, while a short gate line 130 is connected with a long gate auxiliary lines 140. If a gate line 130 and its corresponding gate auxiliary line 140 are set to be in one group, the length of the gate line 130 and the length of the corresponding gate auxiliary line 140 are added up as a length of the group. In order to achieve better display effect, every length of the multiple groups can be set as desired.

In accordance with some embodiments of the disclosed subject matter, a display device that comprises a circular array substrate described above can be provided. The display device can be any suitable device that has a display function.

Figure 4:
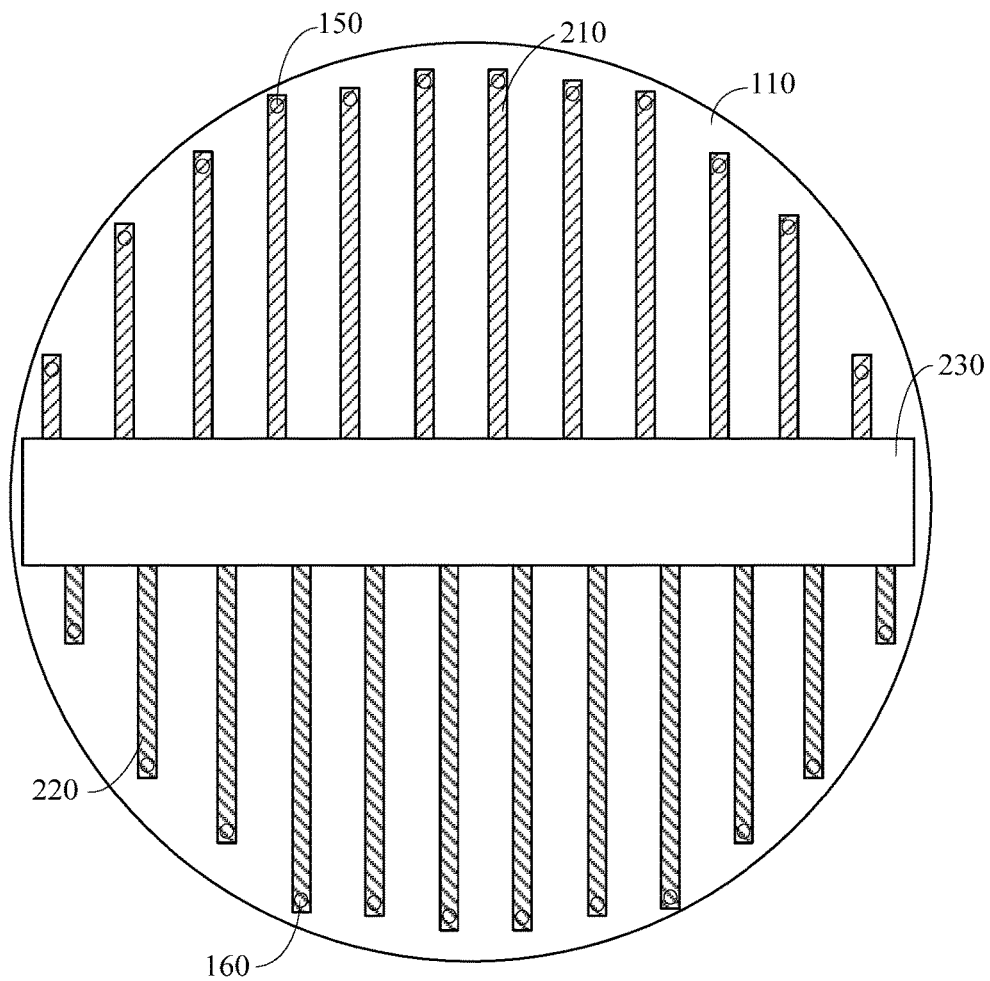
FIG. 4 is a schematic structural diagram of a back view of an exemplary display device including the exemplary circular array substrate shown in FIG. 2 in accordance with some embodiments of the disclosed subject matter.
Figure 5:
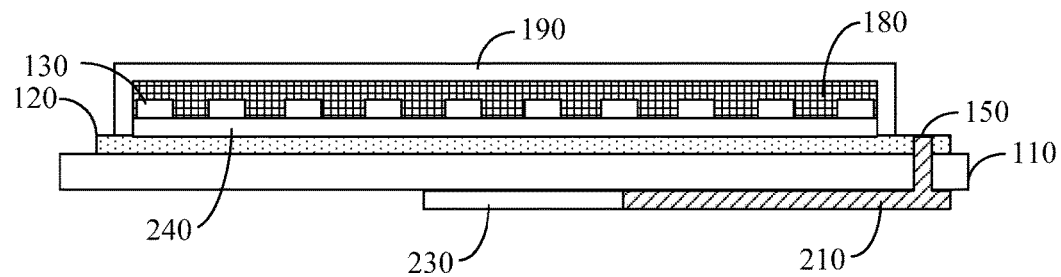
FIG. 5 is a schematic structural diagram of a cross-sectional view of the exemplary display device shown in FIG. 4 in accordance with some embodiments of the disclosed subject matter.

Turing to FIGS. 4 and 5, schematic structural diagrams of an exemplary display device using the exemplary circular array substrate shown in FIG. 2 in a back view and in a cross-sectional view are shown in accordance with some embodiments of the disclosed subject matter.

In some embodiments, the display device can include the circular array substrate described above in connection with FIGS. 2 and 3, driver circuit 230 located on the back side of circular base substrate 110, multiple source driver lines 210, and multiple gate driver lines 220.

As illustrated, multiple source driver lines 210 and multiple gate driver lines 220 are connected with driver circuit 230. Driver circuit 230 can include a driver chip and a flexible circuit board.

In some embodiments, the front side of the array substrate can also include organic light-emitting layer 180 and encapsulation layer 190, as illustrated in FIG. 5. Insulating layer 240 can be formed between the layer of multiple data lines 120 and the layer of multiple gate lines 130.

In accordance with some embodiments of the disclosed subject matter, a method for fabricating a circular array substrate described above can be provided. In some embodiments, the method can include:

Step 1: forming patterns of multiple data lines, multiple gate lines, and multiple gate auxiliary lines on a circular base substrate.

In some embodiments, the multiple data lines are parallel from each other, the multiple gate lines are parallel from each other, and the multiple gate auxiliary lines are parallel from each other. In some embodiments, the multiple data lines are parallel to the multiple gate auxiliary lines. In some embodiments, the number of gate lines is equal to the number of gate auxiliary lines. In some embodiments, each of gate lines is connected with a corresponding gate auxiliary line.

In some embodiments, the patterns of multiple data lines and multiple gate auxiliary lines can be formed in a first layer by a one-time patterning process. The one-time patterning process can include photoresist coating, exposure, development, etching, photoresist peeling, and other suitable processes.

In some embodiments, the patterns of multiple gate lines can be formed in a second layer which is isolated from the First layer by an insulating layer. Each gate line is connected with a corresponding gate auxiliary line through a corresponding third via hole. The multiple third via holes are located at the intersections of the multiple gate lines and their corresponding gate auxiliary lines.

Step 2: forming multiple first via holes and multiple second via holes. The multiple first via holes are located at the ends of multiple data lines and can be used to connect the multiple data lines to the back side of the circular base substrate. The multiple second via holes are located at the ends of multiple gate auxiliary lines and can be used to connect the multiple gate auxiliary lines to the back side of the circular base substrate.

In some embodiments, the multiple first via holes are formed on the edge of one semicircle which corresponds to the same ends of the multiple data lines, while the multiple second via holes are formed on the edge of the opposite semicircle which corresponds to the same ends of the multiple gate auxiliary lines. In this way, the multiple via holes can have a uniform layout and thus can be fabricated commodiously.

Step 3: performing a vapor deposition of electroluminescent material, producing patterns including pixel electrodes, and making encapsulation. In some embodiments, it should be ensured that the multiple first via holes and the multiple second via holes are exposed.

It also should be noted that, each layer of patterns including via holes can be formed by using any suitable patterning process.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a circular array substrate, a fabricating method of the circular array substrate, and a related display device are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. An array substrate, comprising:
a base substrate with a plurality of first via holes and a plurality of second via holes;
a plurality of first signal lines on a first side of the base substrate;
a plurality of first signal driver lines on a second side of the base substrate;
a plurality of second signal lines on the first side of the base substrate;
a plurality of second signal driver lines on the second side of the base substrate; and
a plurality of signal auxiliary lines on the first side of the base substrate;
wherein:
each first signal line is connected with at least one first signal driver line through at least one first via hole;
each second signal line is connected with at least one second signal driver line through at least one second via hole; and
each second signal line is connected with at least one signal auxiliary line.

2. The array substrate of claim 1, wherein:
the plurality of first signal lines are data lines, the plurality of first signal driver lines are source driver lines; and
the plurality of second signal lines are gate lines, the plurality of second signal driver lines are gate driver lines, the plurality of signal auxiliary lines are gate auxiliary lines.

3. The array substrate of claim 2, wherein:
the data lines are parallel to the gate auxiliary lines; and
a total number of the gate lines is equal to a total number of the gate auxiliary lines.

4. The array substrate of claim 3, wherein:
the data lines and the gate auxiliary lines are in a first layer;
the gate lines are in a second layer;
the array substrate further comprises a plurality of third via holes;
the plurality of third via holes are on intersections of the gate lines and the gate auxiliary lines; and
each gate line is connected with at least one gate auxiliary line through at least one third via hole.

5. The array substrate of claim 4, wherein:
the first via holes are on ends of the data lines that are in a first direction; and the second via holes are on ends of the gate auxiliary lines that are in a second direction that is opposite to the first direction.

6. The array substrate of claim 5, wherein:
the base substrate is substantially a circle;
one gate line that is in a center region of the base substrate is longer than another gate line that is in an edge region of the base substrate; and
one gate auxiliary line that is in a center region of the base substrate is longer than another gate auxiliary line that is in an edge region of the base substrate.

7. The array substrate of claim 6, wherein one gate line that is in the center region of the base substrate is connected with one gate auxiliary line that is in the edge region of the base substrate.

8. A display apparatus, comprising:
the array substrate according to claim 2; and
a driver circuit located on the second side of the base substrate, wherein the gate driver lines and the source driver lines are connected with the driver circuit.

9. A method for fabricating an array substrate, the method comprising:
preparing a base substrate;
forming a plurality of first via holes on the base substrate;
forming a plurality of second via holes on the base substrate;
forming a plurality of first signal lines on a first side of the base substrate;
forming a plurality of first signal driver lines on a second side of the base substrate;
forming a plurality of second signal lines on the first side of the base substrate;
forming a plurality of second signal driver lines on the second side of the base substrate; and
forming a plurality of signal auxiliary lines on the first side of the base substrate;
wherein:
each first signal line is connected with at least one first signal driver line through at least one first via hole;
each second signal line is connected with at least one second signal driver line through at least one second via hole; and
each second signal line is connected with at least one signal auxiliary line.

10. The method for fabricating the array substrate of claim 9, wherein:
the plurality of first signal lines are data lines, the plurality of first signal driver lines are source driver lines; and
the plurality of second signal lines are gate lines, the plurality of second signal driver lines are gate driver lines, the plurality of signal auxiliary lines are gate auxiliary lines.

11. The method for fabricating the array substrate of claim 10, wherein:
the data lines are parallel to the gate auxiliary lines; and
a total number of the gate lines is equal to a total number of the gate auxiliary lines.

12. The method for fabricating the array substrate of claim 11, wherein:
the data lines and the gate auxiliary lines are in a first layer;
the gate lines are in a second layer;
the base substrate further comprises a plurality of third via holes;
the plurality of third via holes are located on intersections of the gate lines and the gate auxiliary lines; and
each gate line is connected with at least one gate auxiliary line through at least one third via hole.

13. The method for fabricating the array substrate of claim 12, wherein:
the first via holes are on ends of the data lines that are in a first direction; and
the second via holes are on ends of the gate auxiliary lines that are in a second direction that is opposite to the first direction.

14. The method for fabricating the array substrate of claim 13, wherein:
the base substrate is substantially a circle;
one gate line that is in a center region of the base substrate is longer than another gate line that is in an edge region of the base substrate; and
one gate auxiliary line that is in a center region of the base substrate is longer than another gate auxiliary line that is in an edge region of the base substrate.

15. The method for fabricating the array substrate of claim 14, wherein one gate line that is in the center region of the base substrate is connected with one gate auxiliary line that is in the edge region of the base substrate.

16. A method for fabricating a display apparatus, comprising:
fabricating the array substrate according to claim 10; and
forming a driver circuit on the second side of the base substrate;
wherein the gate driver lines and the source driver lines are connected with the driver circuit.

* * * * *